(12) United States Patent
Honda

(10) Patent No.: US 6,897,725 B2
(45) Date of Patent: May 24, 2005

(54) CLASS D AMPLIFIER

(75) Inventor: Jun Honda, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/106,854

(22) Filed: Mar. 27, 2002

(65) Prior Publication Data

US 2002/0149426 A1 Oct. 17, 2002

(30) Foreign Application Priority Data

Mar. 30, 2001 (JP) ........................................ 2001-099096

(51) Int. Cl.[7] .............................................. H03F 21/00
(52) U.S. Cl. ..................................... 330/207 A; 330/251
(58) Field of Search .......................... 330/2, 10, 207 A, 330/251

(56) References Cited

U.S. PATENT DOCUMENTS

| | | | |
|---|---|---|---|
| 4,649,565 A | | 3/1987 | Kaizer et al. |
| 5,524,171 A | | 6/1996 | de Boisriou |
| 5,606,289 A | | 2/1997 | Williamson |
| 5,973,368 A | * | 10/1999 | Pearce et al. ................ 257/368 |
| 6,016,075 A | * | 1/2000 | Hamo .......................... 330/10 |
| 6,229,389 B1 | * | 5/2001 | Pullen et al. .................. 330/10 |
| 6,362,683 B1 | * | 3/2002 | Miao et al. .................... 330/10 |
| 6,414,560 B2 | * | 7/2002 | Delano ........................ 332/107 |
| 6,420,930 B1 | * | 7/2002 | Takagishi ..................... 330/251 |
| 6,441,685 B1 | * | 8/2002 | MacMillan .................... 330/10 |
| 6,489,841 B2 | * | 12/2002 | Takagishi ..................... 330/10 |
| 6,577,186 B2 | * | 6/2003 | Berkhout ...................... 330/10 |

FOREIGN PATENT DOCUMENTS

| | | |
|---|---|---|
| JP | 59-183510 | 10/1984 |
| JP | 2000-138542 | 5/2000 |
| JP | 2000-0269749 | 9/2000 |

OTHER PUBLICATIONS

European Patent Office Search Report on European Patent Application No. EP 02 25 2142, dated Nov. 5, 2003.

* cited by examiner

Primary Examiner—Henry Choe
(74) Attorney, Agent, or Firm—McGinn & Gibb, PLLC

(57) ABSTRACT

A class D amplifier is provided with a frequency characteristic compensation function. An automatic frequency characteristic compensation circuit is disposed at an input unit of a class D amplifier. The frequency characteristic of the class D amplifier is automatically measured while a load is connected, using a test signal having a predetermined frequency and signal level. An inverse characteristic is computed for compensating the frequency characteristic to the design frequency characteristic, and the inverse characteristic is set in the automatic frequency characteristic compensation circuit.

13 Claims, 4 Drawing Sheets $A'(f) = \beta(f) - A(f)$ $A(f) + A'(f)$

CLASS D AMPLIFIER

BACKGROUND OF THE INVENTION

1. Field of the Invention

The present invention relates to a class D amplifier.

2. Description of the Related Art

In recent years, amplifiers using a class D amplifying method have become more widespread due to the demands for miniaturization and high efficiency requirements of amplifiers.

A class D amplifying method is a method described as follows: In the first place, modulation processing such as pulse width modulation (PWM) or pulse density modulation (PDM) is performed on an analog signal which is input to an amplifying circuit. Then the digital signal which is converted from the input signal by the above modulation processing is amplified. Next, the amplified signal is passed through a low-pass filter and is converted back to an analog signal. In an amplifier using a class D amplifying method, the analog signal can be amplified only by amplifying the digital signal, that is, only by ON/OFF signal processing. Thus, theoretically, 100% power efficiency can be obtained.

Thus, amplifiers using a class D amplifying method are highly efficient, thereby making miniaturization.

In this regard, as the low-pass filter used for the output from a class D amplifier, an LC-type low-pass filter has been widely used. The LC-type low-pass filter typically comprises passive elements such as an inductor, a capacitor, and so on. Such an LC-type low-pass filter has many advantages, for example, low power loss and stable characteristics.

In designing such an LC-type filter, the design is made on the assumption that a load having a constant impedance, which is called a "nominal impedance", is connected to the filter. However, the load impedance which is connected to the output of a class D amplifier, in other words, the output of the LC-type filter, may fluctuate. If this impedance value deviates from the nominal impedance, the frequency characteristic of the LC-type filter fluctuates considerably because of the nature of the LC-type filter. Thus, there is a shortcoming in that, the frequency characteristic of the class D amplifier, as a whole, differs from the design value.

Particularly, in the case of a speaker, which is usually used as the load of an amplifier, the following problem occurs: The impedance of the speaker may deviate from its nominal impedance in the high frequency band due to the configuration of the magnetic circuit of a voice coil unit in the speaker, and the characteristic of a network circuit which is inserted at the pre-stage of the speaker.

Accordingly, in a conventional class D amplifier, an impedance compensation circuit, such as a Zobel element, is connected to the load end of the low-pass filter for output in parallel with a load. This means that it has been necessary to compensate the impedance characteristic of a speaker, which is a load, by using such an impedance compensation circuit.

However, with a compensation circuit composed of such passive elements, its compensation ability is limited, and the circuit cannot cope with a wide range variation of the load impedance. Also, with such a compensation circuit, there is a problem in that, once compensation is performed for a specific speaker which is connected as a load, the previously adjusted compensation circuit cannot function when the speaker is replaced with another speaker.

OBJECT AND SUMMARY OF THE INVENTION

The present invention has been developed in order to eliminate the shortcomings described above, and an object is to provide a class D amplifier having a frequency characteristic compensation function which measures the frequency characteristic of the entire class D amplifier including a connected load, and automatically adjusts the frequency characteristic of the frequency characteristic compensation circuit contained in the input unit of the class D amplifier.

In the present invention, there is provided a class D amplifier having a class D amplifier circuit and a filter circuit to which an output of the class D amplifier circuit is connected, including: an input signal compensation unit which performs compensation processing on the frequency characteristic of an input signal of the class D amplifier in response to a frequency characteristic compensation signal; a test signal generating unit which generates a test signal having a predetermined frequency and signal level, and supplies the test signal to the input of the class D amplifier circuit; a signal level measuring unit which measures the signal level of the test signal after passing through the class D amplifier circuit and the filter circuit; and a compensation signal generating unit which generates the frequency characteristic compensation signal for maintaining the variation of the frequency characteristic of the class D amplifier within a predetermined range, based on the measurement result of the signal level measuring unit.

DETAILED DESCRIPTION OF THE PREFERRED EMBODIMENT

Figure 1:
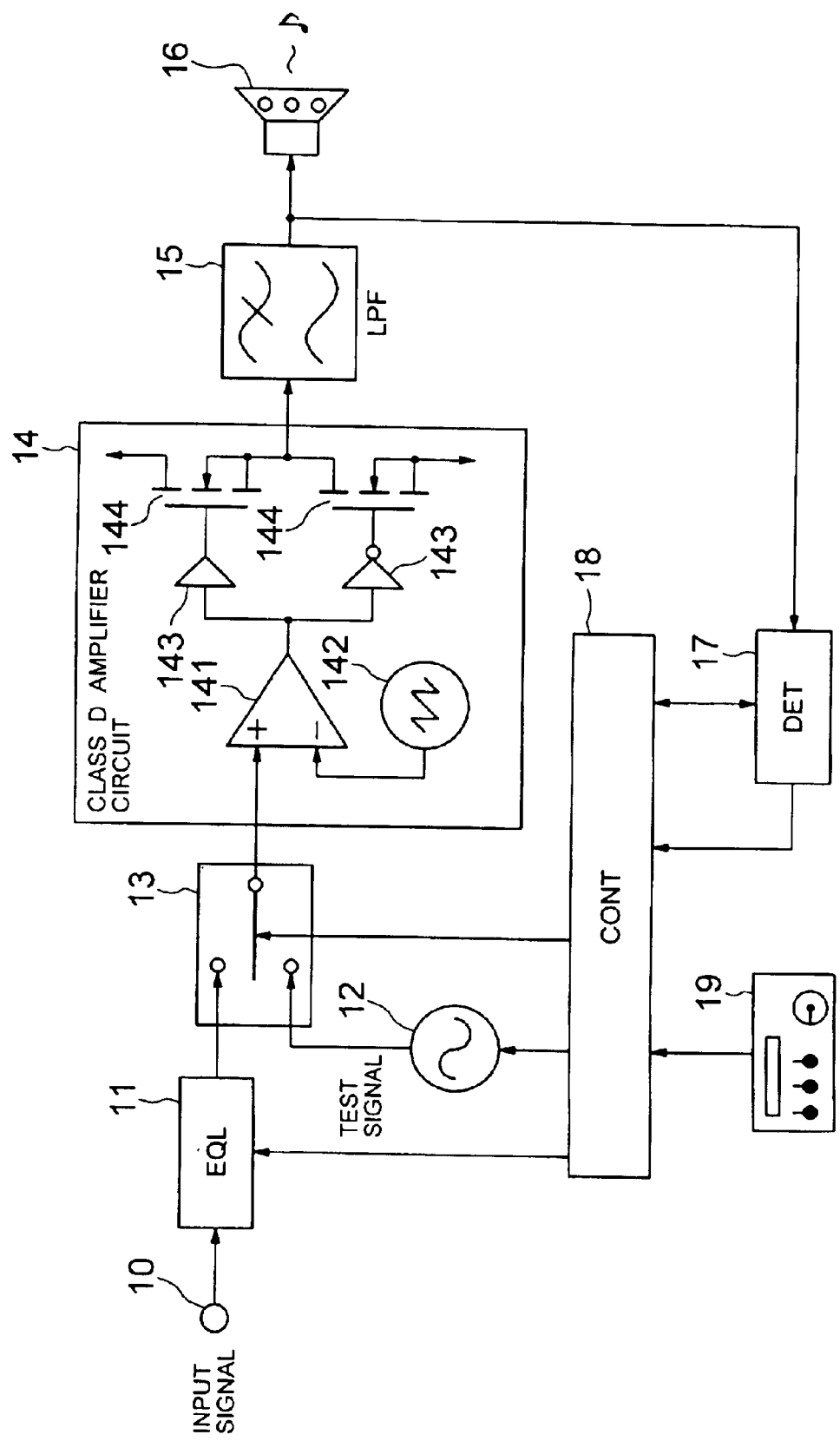
FIG. 1 is a block diagram illustrating the configuration of a class D amplifier having a frequency characteristic compensation function according to an embodiment of the present invention.

FIG. 1 is a block diagram illustrating the configuration of a class D amplifier according to the present invention.

In FIG. 1, a frequency characteristic compensation circuit 11 compensates the frequency characteristic of an input signal from a signal input terminal 10. Such frequency characteristic compensation is performed with regard to a predetermined frequency band of an input signal. The frequency characteristic compensation circuit 11 may be configured, for example, of a type of stagger amplifier in which a plurality of stages of narrow-band variable gain amplifiers having different center frequencies are connected. The gain of the amplifier at each stage may be varied by a frequency characteristic compensation instruction from a control circuit 18 described below.

A test signal generating circuit 12 is an oscillation circuit which generates a test signal to be used for measuring the frequency characteristic of the class D amplifier. The circuit may comprise a PLL synthesizer in which a crystal oscillator or a ceramic oscillator is used as an oscillation source. Also, the circuit can generate an arbitrary-frequency signal at a predetermined frequency interval within a predetermined band. Moreover, if the frequency accuracy of the test signal is of little importance, the oscillation circuit may be configured as a simple VCO (Voltage-Controlled Oscillator). In this regard, the frequency generated by the test signal generating circuit 12, is determined by the control instruction from the control circuit 18.

A signal switching circuit 13 is an analog switch using, for example, an FET, a transistor, or a mercury relay. The circuit connects either the input signal or the test signal to an input unit of the class D amplifier circuit 14 in accordance with the control circuit 18. In this regard, the input signal is supplied from an audio device through the signal input terminal 10 and the frequency characteristic compensation circuit 11. On the other hand, the test signal is supplied from the test signal generating circuit 12.

The class D amplifier circuit 14 mainly includes a comparator circuit 141, a triangular-wave oscillating circuit 142, output stage driver circuits 143, and output stage circuits 144. The comparator circuit 141 compares the signal which is input through the signal switching circuit 13 with the triangular wave from the triangular-wave oscillating circuit 142. Then the comparison result is output as a two-level signal. Thus the amplitude variation of the input signal is converted to the variation in pulse width of the two-level signal. This means that a pulse width modulated signal is produced from the input signal by this processing. Also, the output stage driver circuits 143 produce two signals having phases inverted with respect to each other from the PWM signal, and drive the gates of the output stage circuits 144. The output stage circuits 144 are power switching circuits composed of, for example, MOSFETs.

A low-pass filter 15 for the class D amplifier is a circuit to suppress higher harmonic components contained in the output signal of the class D amplifier circuit 14. This means that the low-pass filter 15 is a circuit which extracts and reproduces the frequency components and amplitude components of the input signal, from the output signal of the class D amplifier circuit 14. In general, the low-pass filter 15 comprises an LC-type low-pass filter which has low power loss.

Also, a speaker 16 converts an electrical signal from the low-pass filter 15 to an acoustic signal and outputs the acoustic signal.

A test signal measuring circuit 17 is a signal level measuring circuit composed of, for example, a high impedance buffer amplifier and an A/D converter. This circuit measures the signal level of the test signal which is output from the low-pass filter 15 and supplied to the speaker 16, that is, the load. Also, the circuit extracts the test signal without influencing either the low-pass filter 15 or the load.

A control circuit 18 mainly comprises a microcomputer (hereinafter referred to as μCPU), and controls the operations of the entire class D amplifier shown in FIG. 1. In this regard, the control circuit 18 includes memory elements such as a ROM (Read Only Memory) and a RAM (Random Access Memory). The ROM stores a main program for performing circuit operations and various subroutines. The μCPU described above executes these programs in synchronization with an internal clock. Also, the RAM temporally stores the results of the various processing during the circuit operations and the statuses of the various flag registers indicating processing results.

An operation input circuit 19 permits users to operate the class D amplifier shown in FIG. 1. The operation input circuit 19 comprises a numeric keypad, various function keys, and an interface circuit between these units and the control circuit 18. In this regard, the numeric keypad and various function keys are implemented on the console panel (not shown) of the class D amplifier casing. When a user performs compensation processing of the frequency characteristic of the class D amplifier, a load is connected to the class D amplifier, the processing is executed by entering a predetermined instruction using the operation input circuit 19.

A description will be given of the compensation processing of the frequency characteristic of the class D amplifier shown in FIG. 1 with reference to the flowchart shown in FIG. 2.

Figure 2:
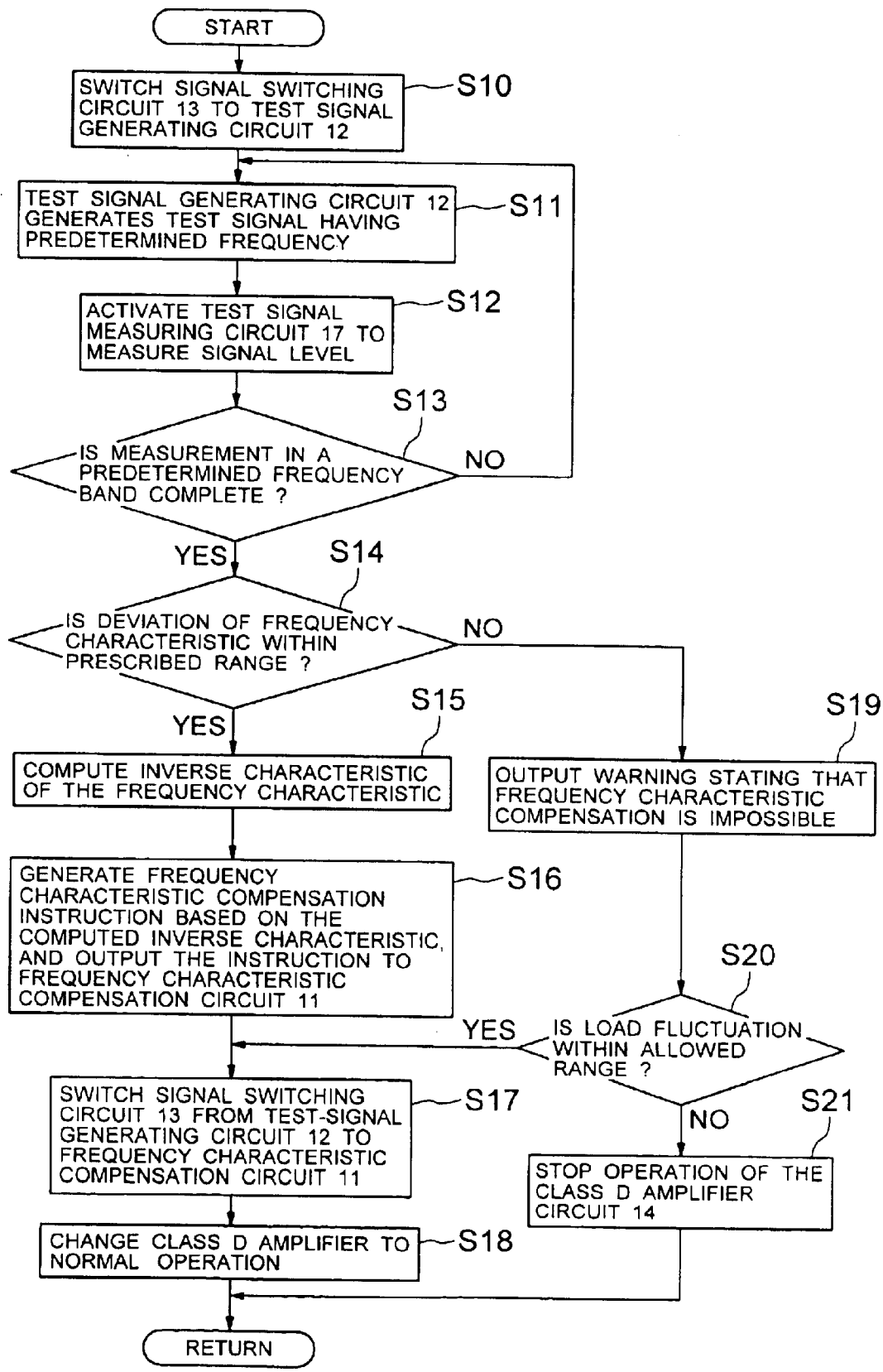
FIG. 2 is a flowchart illustrating the compensation processing of the frequency characteristic of the apparatus shown in FIG. 1.

The processing shown by the flowchart in FIG. 2 may be started at the initialization operation when the power of the class D amplifier shown in FIG. 1 is turned on. Also, the processing of FIG. 2 may be started at any time by the manual operation of a user through the operation input circuit 19. Furthermore, as described below, the processing of FIG. 2 may be started by the control signal supplied from a digital audio device connected at the pre-stage of the class D amplifier.

Upon starting the control routine shown in the flowchart of FIG. 2, the control circuit 18 issues a signal control instruction. The signal control instruction controls the input of the amplifier circuit 14 to be switched to the test signal generating circuit 12 from the signal switching circuit 13 (step 10). Then the control circuit 18 supplies a predetermined test signal generating instruction to the test signal generating circuit 12 for generating the test signal having a predetermined frequency and signal level (step 11).

This test signal is applied to the input unit of the class D amplifier circuit 14 through the signal switching circuit 13. The test signal is converted into a PWM signal in the class D amplifier circuit 14, and the pulse waveform is power-amplified. The low-pass filter 15 eliminates the higher harmonic waves which are superposed on the output signal from the class D amplifier circuit 14. The output signal from which the higher harmonic waves are eliminated is supplied to the speaker 16, that is, the load, from the low-pass filter 15.

In step 11, when the control circuit 18 drives the test signal generating circuit 12 to generate the test signal, it also instructs the test signal measuring circuit 17 to operate in synchronization with this timing. This means that the control circuit 18 measures the output level of the test signal which is supplied to the speaker 16 through the low-pass filter 15, using the test signal measuring circuit 17 (step 12).

As described above, the test signal applied to the class D amplifier circuit 14 has a predetermined frequency and signal level. Accordingly, the known input signal level and the measured value of the output signal level are compared, and thus an input/output characteristic of the class D amplifier circuit 14 and the low-pass filter 15 can be obtained.

The control circuit 18 iteratively executes the processing of step 11 and step 12 at a predetermined frequency interval within a predetermined frequency band (step 13). Consequently, when the iteration operation of step 13 is complete, the following input/output characteristics are obtained. This means that the input/output characteristic of the class D amplifier circuit 14 and the low-pass filter 15 within a predetermined frequency band when the load is connected are obtained. In this regard, the input/output characteristic of the class D amplifier circuit 14 and the low-pass filter 15 corresponds to a frequency characteristic A(f) before compensation.

Next, the control circuit 18 determines whether or not the frequency characteristic A(f) falls within the variation which is previously prescribed (step 14). This determination is performed, because sometimes it is impossible to compensate the frequency characteristic of the class D amplifier connected to the load, when the load impedance connected to the output of the low-pass filter 15 varies greatly.

In step 14, when the frequency characteristic A(f) falls within the previously prescribed variation, the control circuit 18 computes an inverse characteristic A'(f) of the frequency characteristic A(f) (step 15). The relationship between A(f) and A'(f) may be expressed, for example, as follows:

$$\beta(f)=A(f)+A'(f)$$

where β(f) gives the frequency characteristic of the class D amplifier including the connected load, when the output end of the low-pass filter 15 is terminated with a nominal impedance at design time. This means that, the inverse characteristic A'(f) can be referred to as a compensation-frequency characteristic for compensating the frequency characteristic A(f) to the frequency characteristic β(f) at design time.

In step 15, the control circuit 18 computes the inverse characteristic A'(f) in accordance with predetermined conditions. Then the control circuit 18 supplies the frequency characteristic compensation instruction on the basis of the inverse characteristic A'(f) to the frequency characteristic compensation circuit 11 (step 16). The frequency characteristic compensation circuit 11 sets the compensation characteristic within a predetermined frequency band based on the instruction.

When the above processing is complete, the control circuit 18 supplies the signal switching circuit 13 with the control instruction for switching the input of the class D amplifier circuit 14 from the test signal generating circuit 12 to the frequency characteristic compensation circuit 11 (step 17). Then, the control circuit 18 changes the operation of the class D amplifier to the normal operation (step 18).

By performing a series processes, the input signal, such as an audio signal supplied from the signal input terminal 10, is compensated by the inverse characteristic A'(f) in the frequency characteristic compensation circuit 11. Then the compensated input signal is transmitted to the speaker 16, which is the load, after being adjusted by the frequency characteristic of the class D amplifier circuit 14 and the low-pass filter 15.

The frequency characteristic of the class D amplifier shown in FIG. 1 is as follows:

$$A(f)+A'(f)=\beta(f).$$

With this arrangement, a predetermined frequency characteristic β(f), which is obtained when the output of the class D amplifier is terminated with the nominal impedance at design time, is achieved.

Figure 3A:
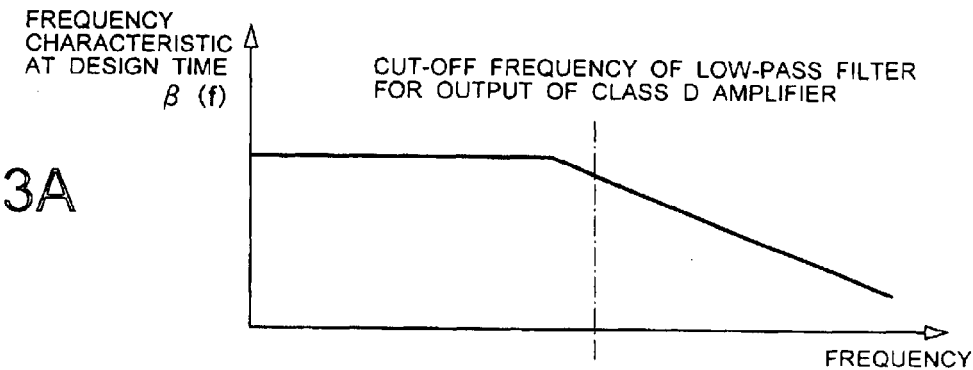
FIGS. 3A to 3D are diagrams illustrating the compensation of the frequency characteristics of the apparatus shown in FIG. 1.
Figure 3B:
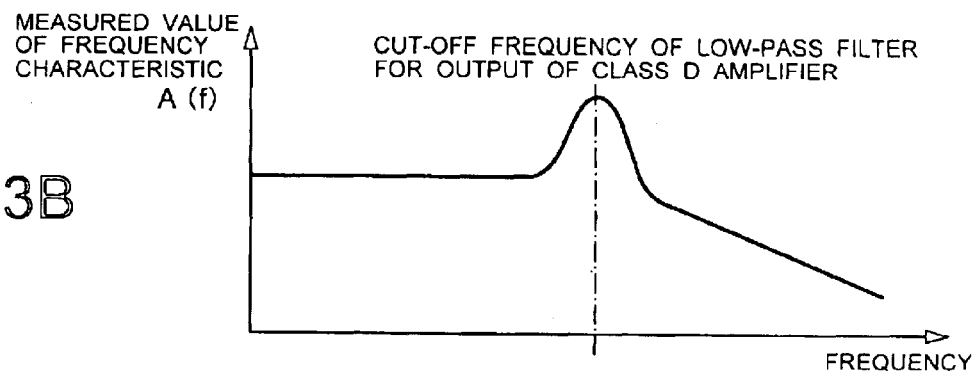
Figure 3C:
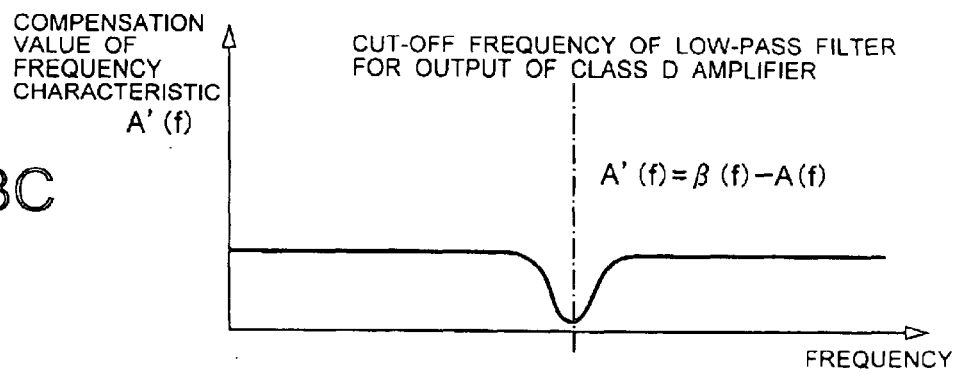
Figure 3D:
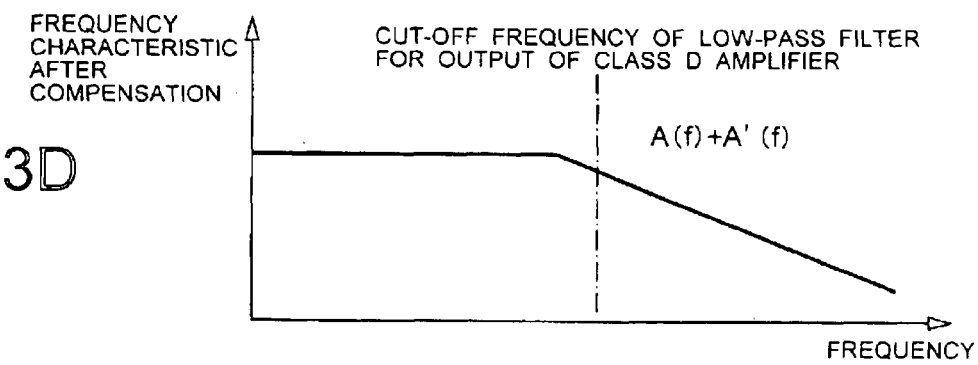

The changes of the frequency characteristic are shown in FIGS. 3A to 3D. FIG. 3A shows the frequency characteristic β(f), when the output of the low-pass filter 15 is terminated by the nominal impedance at the design time. Also, FIG. 3B shows the frequency characteristic A(f) before compensation which is obtained by connecting the actual load. Further, FIG. 3C shows the compensation characteristic A'(f) which is computed from the frequency characteristic A(f), and set in the frequency characteristic compensation circuit 11. Then FIG. 3D shows a frequency characteristic which is obtained when the compensation processing of the frequency characteristic is performed in the frequency characteristic compensation circuit 11. This means that, FIG. 3D shows the frequency characteristic of the entire class D amplifier, that is, A(f)+A'(f).

In this regard, if the value of the load impedance becomes larger than the nominal value, due to the nature of the low-pass filter 15 composed of an LC-type filter, the frequency characteristic is indicated by the line shown in FIG. 3B. This means that, the characteristic shows a protrusion or "bump" having a center at the cut-off frequency of the low-pass filter 15. In such a case, the input signal from the signal input terminal 10 is processed by the compensation processing which has a depression characteristic having a center at the cut-off frequency of the low-pass filter 15, as shown in FIG. 3C. Consequently, the frequency characteristic of the entire class D amplifier is compensated so as to eliminate the "bump" described above, and have a shape as shown in FIG. 3D.

On the other hand, in step 14 in FIG. 2, if the measured frequency characteristic does not fall within a predetermined variation, the following processing is performed. In the control circuit 18, the processing goes to step 19, and outputs a warning stating that the compensation of the frequency characteristic of the class D amplifier is impossible. By this means, the control circuit 18 can warn the user. Then, the control circuit computes a variance value of the load impedance which has caused the frequency characteristic to deviate from the nominal value, using the measured value of the test signal level. Next, the control circuit 18 determines whether or not the variance value of the load impedance is allowed for using the class D amplifier (step 20).

If the variance of the load impedance is within a range which allows use of the class D amplifier, the control circuit 18 goes back to step 17, and starts the normal operation of the class D amplifier. In this case, in step 19, a warning (for example, a warning display), which states that the compensation of the frequency characteristic is impossible, is output. Thus the user can check the load, such as a speaker, which is connected to the class D amplifier.

On the other hand, in step 20, if the variance of the load impedance deviates from the allowable range of the class D amplifier because of, for example, a short circuit or disconnection of the load, the following processing is performed. This means that, in this case, if the operation continues as it is, a problem might occur in the output stage element of the class D amplifier circuit 14 due to a large electric current. Thus in step 21, the control circuit 18 stops the operation of the class D amplifier circuit 14 and terminates the processing shown in FIG. 2.

In the compensation processing of the frequency characteristic shown in FIG. 2, various conditions such as the frequency of the test signal and the number of measurement points are set in the memory included in the control circuit 18 in advance. Also, a plurality of measurement patterns in which these conditions are varied may be prepared in the memory. In this case, a user may select a measurement pattern by giving a selection instruction using the operation input circuit 19.

In this regard, in the case of a class D amplifier, it is generally known that the frequency characteristic in the region of the cut-off frequency of the low-pass filter 15 becomes unstable in accordance with the fluctuation of the load impedance. Accordingly, measuring of the frequency characteristic by the test signal shown in FIG. 2 may be performed only in the region of the cut-off frequency of the low-pass filter 15.

Also, when the fluctuation of the load impedance is not so extreme, such as when the short circuit or disconnection of the load, the frequency characteristic variation is generally not an extremely steep slope. Accordingly, the measurement processing of the signal level in step 11 and step 12 in FIG.

2 may be performed at a few measuring points for the test signals having different frequencies.

In this regard, the form of the instability of the frequency characteristic in the region of the cut-off frequency of the low-pass filter 15, which is derived from the fluctuation of the load impedance, has the following feature. The shape of instability is uniquely determined based on a structure of the low-pass filter 15. Thus measuring of the frequency characteristic by the test signal may be limited to only at the cut-off frequency of the low-pass filter 15 or at a very few frequency points in the region of the cut-off frequency. The frequency characteristic within a predetermined frequency band can be obtained based on these measurement values, and the structure of the low-pass filter 15.

In this connection, the cut-off frequency of the low-pass filter 15 is typically set to about 40 kHz in relation to the suppression of higher harmonic waves which arise from the modulation, such as PWM (Pulse Width Modulation). On the other hand, the upper limit of audible frequencies for a human being is generally assumed to be about 20 kHz. Accordingly, by measuring the frequency characteristic using the test signal only at the cut-off frequency or in the region thereof, even if the test signal is output from the speaker 16, there is no risk of affecting the hearing of the user.

Figure 4:
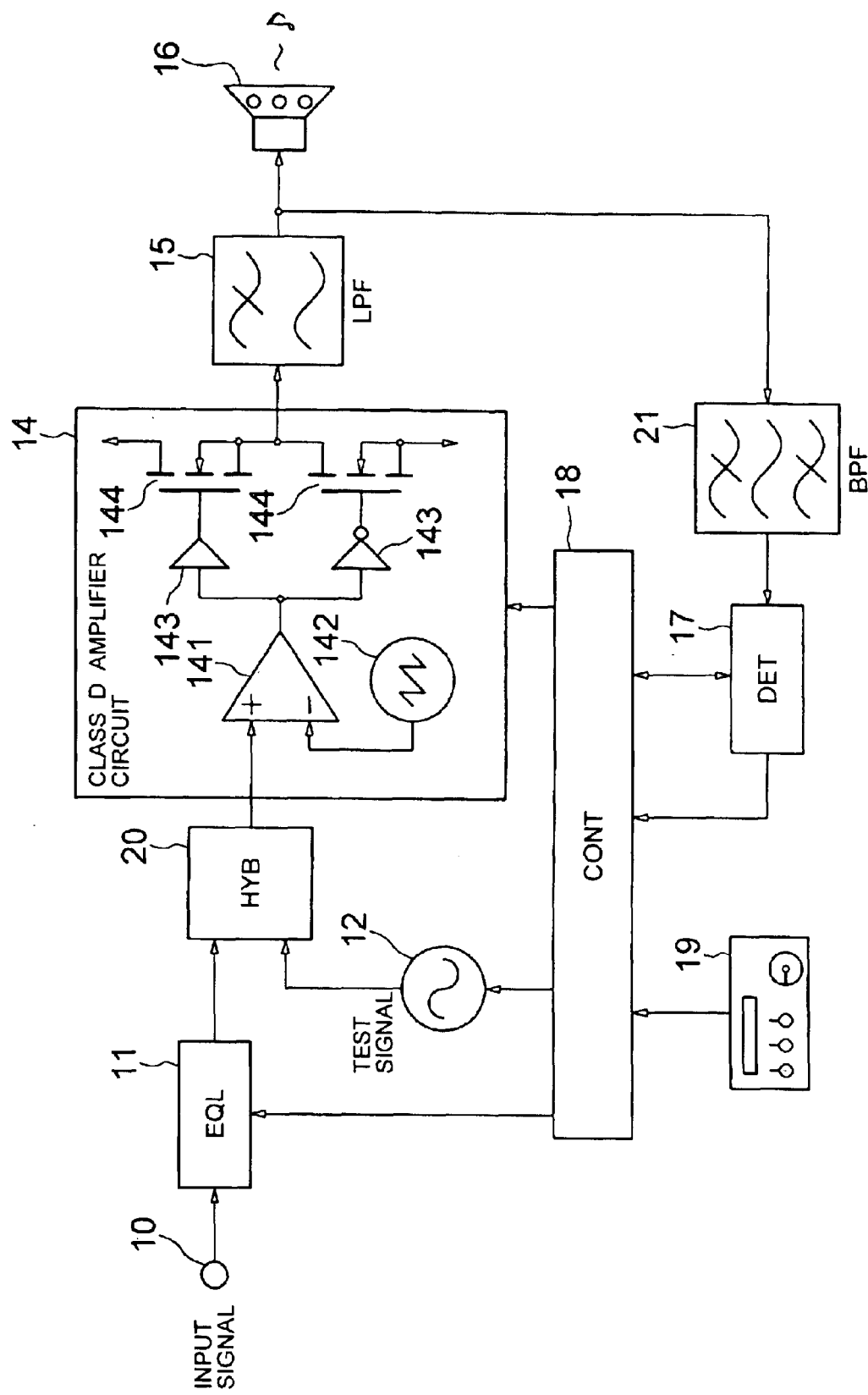
FIG. 4 is a block diagram illustrating the configuration of the class D amplifier having a frequency characteristic compensation function according to a second embodiment of the present invention.

Another embodiment of a class D amplifier having the frequency characteristic compensation function according to the present invention is illustrated in a block diagram in FIG. 4.

In the configuration shown in FIG. 4, a signal-superposing circuit 20 is used instead of the signal switching circuit 13. For example, a signal-adding circuit or a signal-hybrid circuit corresponds to the signal-superposing circuit 20.

In the embodiment shown in FIG. 4, the signal superposing circuit 20 generates a superposed signal by combining the input signal which passes through the frequency characteristic compensation circuit 11, and the test signal from the test signal generating circuit 12. Then, the superposed signal is supplied to the input of the class D amplifier circuit 14. In connection with this arrangement, in the embodiment in FIG. 4, a band-pass filter 21 for extracting the test signal is disposed at the output of the low-pass filter 15. This means that, a configuration in which the test signal is extracted using the band-pass filter 21, and then supplied to the test signal measuring circuit 17, is adopted. In this regard, the band-pass filter 21 for extracting the test signal must affect the output signal of the low-pass filter 15 as little as possible. Thus, the band-pass filter 21 may be an active filter having a high input impedance.

In the embodiment shown in FIG. 4, the input signal and the test signal can be simultaneously supplied to the class D amplifier circuit 14. Accordingly, by setting the frequency of the test signal to a value higher than the audible frequency of a human being, leakage of the test signal from the speaker 16 cannot be perceived by the user. Thus, it is possible to compensate the frequency characteristic of the entire class D amplifier, when the load is constantly connected during operation of the class D amplifier. For example, by setting the frequency of the test signal in the region of the cut-off frequency of the low-pass filter 15, this operation becomes possible.

The present invention is not limited to the embodiments described above. For example, the signal input unit, the test signal measuring circuit 17, and the control circuit 18 in the block diagram shown in FIG. 4 may be included and configured on a one-chip digital signal processor (hereinafter referred to as DSP). In the case of FIG. 1, the frequency characteristic compensation circuit 11, the test signal generating circuit 12, the signal switching circuit 13, and so on may be placed on a one-chip DSP. In the case of FIG. 4, the frequency characteristic compensation circuit 11, test signal generating circuit 12, the signal-superposing circuit 20, and so on may be placed on a one-chip DSP. With this arrangement, it is possible to perform all processes from the measuring of the frequency characteristic of the test signal to the compensation of the frequency characteristic for the input signal only by software.

Furthermore, the input unit of the class D amplifier circuit 14, that is, the comparator circuit 141 and the triangular wave oscillating circuit 142, may be included on the one-chip DSP. Accordingly, miniaturization of the entire device, reduction of power consumption, and improved reliability can be obtained.

On the other hand, the signal input circuit of the DSP is configured such that a digital signal can be directly input. Accordingly, a digital signal can be directly input from a digital audio device, for example, an MD player, a digital tuner, and so on, which is connected to the pre-stage of the class D amplifier, through the signal input terminal 10.

Also, the class D amplifier can be configured such that, for example, a control signal regarding information of the input signal, such as the start, interval, and so on of a musical performance, is supplied from the digital audio devices. With this arrangement, it is possible to automatically detect an interruption in the input signal of the musical performance to the class D amplifier, and to perform the compensation processing of the frequency characteristic.

In this regard, in each embodiment described above, the class D amplifier has only one channel, but the present invention is not limited to a signal channel configuration. Accordingly, each embodiment described above the signal amplifier channel may be configured for stereo, or a class D amplifier having multiple channels.

As described above, in the present invention, the configuration is such that the frequency characteristic of a class D amplifier is automatically measured while a speaker, that is, the load, is connected, and the frequency characteristic is compensated. Consequently, in the range in which compensation is possible, the frequency characteristic of the entire class D amplifier will not vary from the design value, when any speaker is connected.

Also, by setting the frequency of the test signal outside of the audible bandwidth, it is possible to constantly measure the frequency characteristic, and perform the compensation processing while the class D amplifier is operating normally. Moreover, the test tone played through the speaker will not annoy the user.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on Japanese Patent Application No. 2001-99096 which is hereby incorporated by reference.

What is claimed is:

1. A class D amplifier, comprising:
   a class D amplifier circuit;
   a filter circuit connected to an output of the class D amplifier circuit;

a frequency characteristic compensation circuit which performs compensation processing on a frequency characteristic of an input signal of the class D amplifier based on a frequency characteristic compensation signal;

a test signal generator which generates a test signal having a predetermined frequency range and signal level, and supplies the test signal to the input of the class D amplifier circuit;

a signal level measuring circuit which measures the signal level of the filtered signal from the filter circuit; and a control circuit which generates the frequency characteristic compensation signal for maintaining variations of the frequency characteristic of the class D amplifier within a predetermined range, based on a measurement result by the signal level measuring circuit.

2. A class D amplifier according to claim 1, wherein the filter circuit comprises an LC-type low-pass filter.

3. A class D amplifier according to claim 1, wherein the frequency range of the test signal includes at least a cut-off frequency of the filter circuit.

4. A class D amplifier according to claim 3, wherein the filter circuit comprises an LC-type low-pass filter.

5. A class D amplifier, comprising;

a test signal generator for generating a test signal having a predetermined frequency range to be processed by said class D amplifier;

a compensation circuit for maintaining variations of the frequency characteristic of said class D amplifier within a predetermined range, based on a measurement result of the test signal processed by said class D amplifier; and a switch for selecting one of said test signal and an input signal from an input signal terminal of said class D amplifier, wherein said class D amplifier processes the selected signal from said switch.

6. A class D amplifier, comprising:

a test signal generator for generating a test signal having a predetermined frequency range to be processed by said class D amplifier; and a compensation circuit for maintaining variations of the frequency characteristic of said class D amplifier within a predetermined range, based on a measurement result of the test signal processed by said class D amplifier, wherein said compensation circuit comprises:

a control circuit for generating a frequency characteristic compensation signal; and a frequency characteristic compensation circuit controlled by said frequency characteristic compensation signal.

7. The class D amplifier of claim 6, wherein said frequency characteristic compensation circuit comprises a plurality of narrow-band variable gain amplifiers, each said narrow-band variable gain amplifier having a different center frequency.

8. A class D amplifier, comprising:

a test signal generator for generating a test signal having a predetermined frequency range to be processed by said class D amplifier; and a compensation circuit for maintaining variations of the frequency characteristic of said class D amplifier within a predetermined range, based on a measurement result of the test signal processed by said class D amplifier, wherein said test signal generator generates the test signal of a frequency range outside an audible bandwidth, thereby allowing a frequency compensation to be performed as said class D amplifier operates normally.

9. A method of maintaining variations of a frequency characteristic of a class D amplifier within a predetermined range, said method comprising:

providing a test signal of a predetermined frequency range to be processed by said class D amplifier, said test signal originating from a built-in circuit of said class D amplifier;

compensating a frequency characteristic of said class D amplifier based on a measurement result of the test signal processed by said class D amplifier; and selecting one of said test signal and an input signal from an input signal terminal, wherein said class D amplifier processes the selected signal.

10. A method of maintaining variations of a frequency characteristic of a class D amplifier within a predetermined range, said method comprising;

providing a test signal of a predetermined frequency range to be processed by said class D amplifier said test signal originating from a built-in circuit of said class D amplifier; and compensating a frequency characteristic of said class D amplifier based on a measurement result of the test signal processed by said class D amplifier, wherein said test signal comprises a frequency range outside an audible bandwidth, thereby allowing a frequency compensation to be performed as said class D amplifier operates normally.

11. The class D amplifier of claim 6, wherein said frequency characteristic compensation circuit provides a compensation to a frequency characteristic of a non-test input signal into said class D amplifier.

12. A class D amplifier according to claim 1, further comprising:

a switch for selecting one of the test signal and the input signal, wherein said class D amplifier circuit processes the selected signal from said switch.

13. A class D amplifier according to claim 1, further comprising:

a signal superposing circuit connected to an input of said class D amplifier circuit for superposing the test signal on the input signal; and a band-pass filter for filtering the filtered signal from said filter circuit by allowing only a frequency range of the test signal to pass through, wherein said signal level measuring circuit measures the signal level of the filtered signal from said band-pass filter to generate said measurement result.

* * * * *